United States Patent
Passlack et al.

[11] Patent Number: 5,904,553
[45] Date of Patent: May 18, 1999

[54] FABRICATION METHOD FOR A GATE QUALITY OXIDE-COMPOUND SEMICONDUCTOR STRUCTURE

[75] Inventors: Matthias Passlack, Chandler; Jonathan K. Abrokwah; Ravi Droopad, both of Tempe; Brian Bowers, Mesa, all of Ariz.

[73] Assignee: Motorola, Inc., Schaumburg, Ill.

[21] Appl. No.: 08/917,119

[22] Filed: Aug. 25, 1997

[51] Int. Cl.$^6$ .................. H01L 21/3205; H01L 21/4763
[52] U.S. Cl. .................. 438/590; 438/779; 438/782; 427/255.3; 427/453; 427/446
[58] Field of Search .................. 438/590, 779, 438/782; 427/255.3, 453, 446

[56] References Cited

U.S. PATENT DOCUMENTS

| | | | |
|---|---|---|---|
| 4,788,082 | 11/1988 | Schmitt | 427/248.1 |
| 5,164,040 | 11/1992 | Eres et al. | 156/610 |
| 5,256,205 | 10/1993 | Schmitt, III et al. | 118/723 |
| 5,330,610 | 7/1994 | Eres et al. | 117/86 |
| 5,356,672 | 10/1994 | Schmitt, III et al. | 427/446 |
| 5,356,673 | 10/1994 | Schmitt et al. | 427/446 |
| 5,451,548 | 9/1995 | Hunt et al. | 437/225 |
| 5,540,783 | 7/1996 | Eres et al. | 118/725 |
| 5,821,548 | 12/1996 | Hinchliffe | 250/492.21 |

Primary Examiner—John F. Niebling
Assistant Examiner—David A. Zarneke
Attorney, Agent, or Firm—Eugene A. Parsons

[57] ABSTRACT

A method of fabricating a gate quality oxide-compound semiconductor structure includes forming an insulating $Ga_2O_3$ layer on the surface of a compound semiconductor wafer structure by a supersonic gas jet containing gallium oxide molecules and oxygen. In a preferred embodiment, a III–V compound semiconductor wafer structure with an atomically ordered and chemically clean semiconductor surface is transferred from a semiconductor growth chamber into an insulator deposition chamber via an ultra high vacuum preparation chamber. $Ga_2O_3$ deposition onto the surface of the wafer structure is initiated by a supersonic gas jet pulse and proceeds via optimization of pulse duration, speed of gas jet, mole fraction of gallium oxide molecules and oxygen atoms, and plasma energy.

10 Claims, 1 Drawing Sheet

FABRICATION METHOD FOR A GATE QUALITY OXIDE-COMPOUND SEMICONDUCTOR STRUCTURE

FIELD OF THE INVENTION

The present invention pertains to fabrication methods of gate quality oxide-compound semiconductor structures and more specifically to fabrication methods of gate quality oxide-compound semiconductor structures in semiconductor devices.

BACKGROUND OF THE INVENTION

Oxide-semiconductor structures are the major workhorse of the Si semiconductor industry. The requirements for gate quality insulator-semiconductor structures are manifold: (i) low interface state density, e.g. $D_{it} < 10^{11}$ cm$^{-2}$ ev$^{-1}$; (ii) low trap density, e.g. $N_t \leq$ low $10^{11}$ cm$^{-2}$, in the insulating film; (iii) thermodynamic interface and insulator stability; and (iv) interface and insulator reliability in particular related to insulator damage caused by injection of (hot) carriers. So far, the only systems which satisfy all of the above outlined specifications is thermal $SiO_2$—Si, jet vapor deposited (JVD) $Si_3N_4$—Si, and JVD $Si_3N_4$—$SiO_2$—Si.

For Si technology, prior art, for instance A. Malik et al., J. Appl. Phys., 79, 8507 (1996), describes the use of supersonic gas jets for the fabrication of insulating, gate quality silicon nitride films with low $N_t$ on Si. Jet vapor deposition (JVD) uses a supersonic free jet of inert carrier gas to transport vapor species generated from evaporation sources to the surface of a substrate. The quality of silicon nitride films produced by JVD was mainly attributed to a high dissociation efficiency of $N_2$ (up to 60%) in the supersonic beam using an RF discharge source, see for instance, J. E. Pollard, Rev. Sci.Instrum., vol. 63, 1771 (1992), the small fraction of generated ions, and the absence of H in the silicon nitride films. Some effects of high speed gas dynamics and chemical reactions involved are still under discussion. The technique has been particularly applied for rapidly growing metal and semiconducting films on substrates, see for instance, U.S. Pat. No. 4,788,082, entitled "Method and Apparatus for the deposition of Solid Films of a Material from a Jet Stream Entraining the gaseous phase of Said Material", issued Nov. 29, 1988; U.S. Pat. No. 5,164,040, entitled "Method and Apparatus for Rapidly Growing Films on Substrates Using Pulsed Supersonic Jets", issued Nov. 17, 1992, and U.S. Pat. No. 5,356,673, entitled "Evaporation System and Method for Gas Jet Deposition of Thin Film Materials", issued Oct. 18, 1994. Prior art also includes plasma assisted supersonic gas jets, see for instance, U.S. Pat. No. 5,256,205, entitled "Microwave Plasma Assisted Gas Jet Deposition of Thin Film Materials", issued Oct. 26, 1993, U.S. Pat. No. 5,356,672 entitled "Method for Microwave Plasma Assisted Supersonic Gas Jet Deposition of Thin Films, issued Oct. 18, 1994; and pulsed supersonic gas jets, see for instance, U.S. Pat. No. 5,164,040, entitled "Method and Apparatus for Rapidly Growing Films on Substrates Using Pulsed Supersonic Jets", issued Nov. 17, 1992, U.S. Pat. No. 5,330,610, entitled "Method of Digital Epitaxy by Externally Controlled Closed Loop Feedback, issued Jul. 19, 1994, and U.S. Pat. No. 5,540,783, entitled "Apparatus for Externally Controlled Closed Loop Feedback Digital Epitaxy", issued Jul. 30, 1996.

For compound semiconductors, a low interface state density Dit of $2.5 \times 10^{10}$ cm$^{-2}$ ev$^{-1}$ and full accessibility of the GaAs band gap were demonstrated. Pivotal fabrication aspects include (i) an extremely low GaAs surface exposure to impurities (<10–100 Langmuirs) prior to deposition of the insulating film, and (ii) the preservation of GaAs bulk and surface stoichiometry and the complete exclusion of GaAs surface oxidation. Satisfying the latter requirements and using in-situ deposition of specific molecules ($Ga_2O_3$) on GaAs based semiconductor epitaxial layers while maintaining ultra-high vacuum (UHV), resulted in low, $D_{it}$ interfaces. The GaAs surface exposure (predominantly oxygen) prior to completion of the first $Ga_2O_3$ monolayer was typically less than 10 Langmuirs, GaAs surface oxidation was excluded, and GaAs surface stoichiometry preserved. Also, thermodynamic interface stability was demonstrated. See for instance, U.S. Pat. No. 5,451,548 entitled "Electron beam deposition of gallium oxide thin films using a single purity crystal source", issued Sep. 19, 1995, M. Passlack et al., Appl. Phys. Lett., vol. 68, 1099 (1996), Appl. Phys. Lett., vol. 68, 3605 (1996), and Appl. Phys. Lett., vol. 69, 302 (1996).

For compound semiconductors, the remaining problems are associated with stability and reliability issues including charge trapping, carrier injection, and eventually, oxide degradation and breakdown. Trap densities as high as $2 \times 10^{12}$ cm$^{-2}$ have been found in e-beam deposited $Ga_2O_3$ films causing long term drift of device parameters in accumulation and inversion. Consequently, the performance of unipolar and bipolar devices is affected and the fabrication of stable and reliable MOSFETs based on compound semiconductors has been impossible.

Accordingly, it would be highly desirable to provide new methods of manufacturing which overcome these problems.

It is a purpose of the present invention to provide a new and improved method of manufacturing a gate quality oxide-compound semiconductor structure.

It is another purpose of the present invention to provide a new and improved method of manufacturing a gate quality $Ga_2O_3$-compound semiconductor structure.

It is still another purpose of the present invention to provide a new and improved method of manufacturing a gate quality $Ga_2O_3$-compound semiconductor structure with oxide trap density $\leq 10^{11}$ cm$^{-2}$.

It is a further purpose of the present invention to provide a new and improved method of manufacturing a gate quality $Ga_2O_3$-compound semiconductor structure with oxide trap density $\leq 10^{11}$ cm$^{-2}$ and interface state density $\leq 10^{11}$ eV$^{-1}$ cm$^{-2}$.

It is still a further purpose of the present invention to provide a new and improved method of manufacturing a gate quality oxide-compound semiconductor structure with improved stability and reliability.

It is yet a further purpose of the present invention to provide a new and improved method of manufacturing a gate quality oxide-compound semiconductor structure which allows the implementation of stable, reliable, and manufacturable accumulation and/or inversion mode devices using compound semiconductors.

It is still a further purpose of the present invention to provide a new and improved method of manufacturing a gate quality $Ga_2O_3$-compound semiconductor structure which is relatively easy to fabricate and use.

SUMMARY OF THE INVENTION

The above problems and others are at least partially solved and the above purposes and others are realized in a method of fabricating a gate quality oxide-compound semiconductor structure including the steps of providing a compound semiconductor wafer structure with a surface and forming an insulating $Ga_2O_3$ layer on the surface of the wafer structure by a supersonic gas jet of gallium oxide molecules, atomic oxygen, and an inert carrier gas directed onto the surface of the wafer structure.

In a preferred embodiment, a III–V compound semiconductor wafer structure with an atomically ordered and chemically clean semiconductor surface is transferred from a semiconductor growth chamber into an insulator deposition chamber via an ultra high vacuum (UHV) preparation chamber. $Ga_2O_3$ deposition onto the surface of the wafer structure is initiated by a supersonic gas jet pulse and proceeds via optimization of pulse duration, speed of gas jet, mole fraction of gallium oxide molecules and oxygen atoms, and plasma energy.

BRIEF DESCRIPTION OF THE DRAWINGS

Referring to the drawings.

DESCRIPTION OF THE PREFERRED EMBODIMENT

Figure 1:
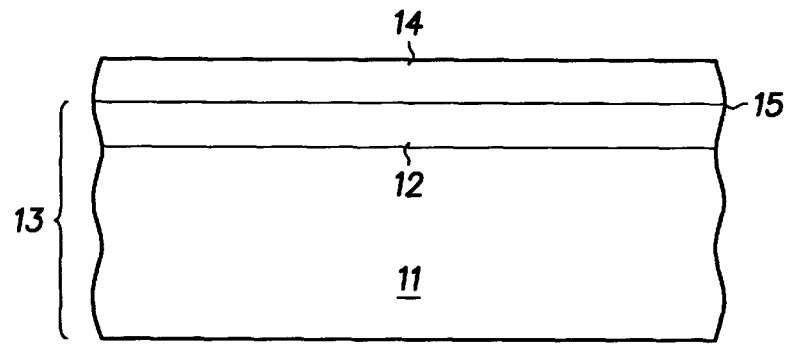
FIG. 1 is a simplified cross-sectional view of a gate quality oxide-compound semiconductor structure in accordance with the present invention.

Referring specifically to FIG. 1, a simplified cross-sectional view of a gate quality oxide-compound semiconductor structure 10 in accordance with the present invention is illustrated. Structure 10 includes a compound semiconductor material, such as any III–V material employed in any semiconductor device, represented herein by a III–V semiconductor substrate 11 and a compound semiconductor epitaxial layer structure 12. For purposes of this disclosure, the substrate and any epitaxial layers formed thereon will be referred to simply as a compound semiconductor wafer structure which in FIG. 1 is designated 13. Compound semiconductor wafer structure 13 has an upper surface 15 onto which an oxide layer 14 is positioned by a supersonic gas jet of gallium oxide molecules, atomic oxygen, and an inert carrier gas directed onto the surface of the wafer structure such that a gate quality oxide-compound semiconductor structure is formed. It will of course be understood that in some specific applications (or on some portions of compound semiconductor wafer structure 13) there may be no epitaxial layers present and upper surface 15 may simply be the upper surface of substrate 11.

Figure 2:
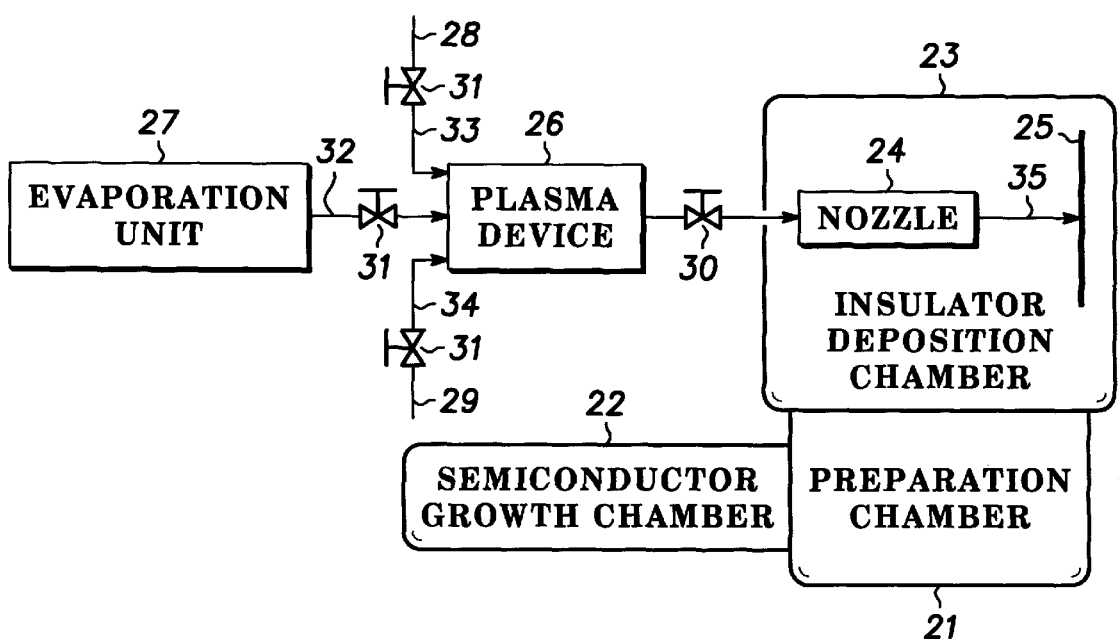
FIG. 2 illustrates a multi-wafer system utilized in fabricating the structure of FIG. 1 in accordance with the present invention.

Referring now to FIG. 2, a multi-wafer epitaxial production system 20 is illustrated which is utilized in fabricating the structure of FIG. 1 in accordance with the present invention. System 20 includes a UHV preparation chamber 21, a UHV semiconductor growth chamber 22 attached to preparation chamber 21, and a UHV jet vapor deposition chamber 23 attached to preparation chamber 21. The UHV jet vapor system comprises the UHV deposition chamber 23, a high speed gas nozzle 24, a fixture to accommodate semiconductor wafers 25, a plasma device 26 attached to deposition chamber 23 via a pulsed valve 30, an effusion cell 27 attached to plasma device 26 via a pulsed valve 31, a supply of inert carrier gas such as helium 28 attached to plasma device 26 via a pulsed valve 31, and a supply of molecular oxygen 29 attached to plasma device 26 via a pulsed valve 31. The high speed nozzle 24 and the fixtures to accommodate the semiconductor wafers 25 are located in UHV deposition chamber 23. The fixture 25 such as a platen is appropriately rotated and/or translated in order to achieve uniform deposition.

In a specific example, the vapors 32 of the depositing species are generated from gallates, $Ga_2O_3$, or gallium evaporated from effusion cell 27. Using gallates or $Ga_2O_3$ as an evaporation source, the vaporization of $Ga_2O_3$ is connected with thermal dissociation $$Ga_2O_3(s) \rightarrow Ga_2O(g) + O_2(g). \tag{1}$$

Subsequently, the vaporized species 32 such as $Ga_2O$ and $O_2$ are mixed into a flow of inert carrier gas 33. Other species such as additional oxygen 34 can also be mixed into the gas flow. The gas flow may be exposed to an RF or microwave plasma 26 before forming a supersonic beam 35 when leaving the high speed nozzle 24.

Thus, as an example of fabricating a gate quality oxide-compound semiconductor structure according to the present invention, a III–V compound semiconductor wafer structure 13 with an atomically ordered and chemically clean upper surface 15 is prepared in UHV semiconductor growth chamber 22, and transferred via preparation chamber 21 to deposition chamber 23. The deposition of $Ga_2O_3$ molecules on the semiconductor surface 15 is initiated by a supersonic gas jet pulse 35 providing a monolayer or submonolayer $Ga_2O_3$ coverage of the semiconductor surface 15. The inverse reaction to (1)

$$Ga_2O(g) + _2(g) \rightarrow Ga_2O_3 \tag{2}$$

occurs during transport of the vapor species to the substrate surface and/or on the substrate surface 15. Reaction (2) should be complete resulting in deposition of $Ga_2O_3$ molecules only. Reaction (2) should also preferentially occur in the supersonic beam 35 before the depositing species reach the semiconductor surface 15 in order to reduce the amount of $O_2$ exposure of the semiconductor surface 15. If reaction (2) is not complete, the following reaction $$3Ga_2O(g) \rightarrow Ga_2O_3(s) + 4Ga(s) \tag{3}$$

simultaneously occurs resulting in $Ga_2O_3$ and metallic Ga. The incorporation of metallic Ga into the $Ga_2O_3$ film severely degrades the film properties. Reaction (3) is favored only when oxygen is deficient and/or the oxygen species are not highly reactive. Since the dissociation efficiency of $0_2$ is as high as 80% in a high speed gas jet when using a discharge plasma, reaction (3) is expected to vanish when using a plasma. Small amounts of additional oxygen 29 can also be introduced. However, complete exclusion of Ga incorporation into the first monolayer or submonolayer of $Ga_2O_3$ may conflict with the requirement of surface exposure to oxygen which is preferably less than 10 Langmuirs before the semiconductor surface 15 is completely covered with $Ga_2O_3$ molecules. Parameters such as pulse duration, speed of gas jet, mole fraction of vaporized $Ga_2O$ and $O_2$ species, introduction of additional oxygen into the jet stream 35, plasma energy etc. have to be optimized to accomplish both complete oxidation of the first gallium oxide monolayer and exclusion of semiconductor surface oxidation in order to achieve $D_{it}$ $10^{11}$ $cm^{-2}$ $eV^{-1}$. The low $D_{it}$ oxide-semiconductor interface is essentially achieved with the complete coverage of the semiconductor surface with $Ga_2O_3$ molecules.

After complete coverage of the semiconductor surface 15 with $Ga_2O_3$ molecules, the parameters such as pulse duration, speed of the gas jet, mole fraction of vaporized $Ga_2O$ and $O_2$ species, introduction of additional oxygen into the jet stream, plasma energy etc. are modified to take full advantage of the high speed gas dynamics of the supersonic jet 35 to produce $Ga_2O_3$ with low $N_t$ (low $10^{11}$ $cm^{-2}$).

Another significant advantage of the technique is the capability to subject any additionally introduced oxygen to the same conditions (jet stream, plasma energy, etc.) as the oxygen stemming from the vaporized sources. This is of particular importance since prior art films deposited with additional molecular oxygen introduced via an oxygen valve exhibited even higher trap density $N_t$ although less metallic Ga was incorporated into the film. This indicates that oxygen subjected to different conditions than that stemming from vaporized sources does not reduce the trap density $N_t$ using prior art e-beam depositions techniques.

Thus, a new and improved method of manufacturing a gate quality oxide-compound semiconductor structure is disclosed. The new and improved gate quality $Ga_2O_3$-compound semiconductor structure provides a low oxide trap density $10^{11}$ cm$^{-2}$ and a low interface state density $10^{11}$ eV$^{-1}$cm$^{-2}$. These improvements essentially solve or overcome the problems of prior art such as dc instability and poor reliability and enable the implementation of stable, reliable, and manufacturable accumulation and/or inversion mode devices using compound semiconductors.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of manufacturing a gate quality oxide-compound semiconductor structure including the steps of:

providing a compound semiconductor wafer structure with a surface; and forming an insulating oxide layer on the surface of the wafer structure by depositing insulating oxide material onto the wafer structure using a supersonic gas jet containing $Ga_2O$, $O_2$ and an O gaseous species, or Ga and an O gaseous species.

2. A method of manufacturing a gate quality oxide-compound semiconductor structure as claimed in claim 1 wherein the step of forming the insulating oxide layer includes the steps of:

depositing the first monolayer of $Ga_2O_3$ such that complete oxidation of the first gallium oxide monolayer and exclusion of semiconductor surface oxidation is accomplished; and depositing a $Ga_2O_3$ film such that low trap density of $Ga_2O_3$ bulk is accomplished.

3. A method of manufacturing a gate quality oxide-compound semiconductor structure comprising the steps of:

providing a multi-wafer epitaxial system including a preparation chamber with a III–V growth chamber attached and a jet vapor deposition chamber attached;

providing a compound semiconductor wafer with a surface;

placing the compound semiconductor wafer in the preparation chamber;

reducing the pressure in the multi-wafer system to $10^{-10}$ Torr;

moving the compound semiconductor wafer to the III–V growth chamber and epitaxially growing layers of compound semiconductor material on the surface of the compound semiconductor wafer; and moving the compound semiconductor wafer to the jet vapor deposition chamber and forming an insulating layer by a supersonic gas jet containing $Ga_2O$, $O_2$ and an O gaseous species, or Ga and an O gaseous species onto the surface layer of compound semiconductor material.

4. A method of manufacturing a gate quality oxide-compound semiconductor structure as claimed in claim 3 wherein the step of providing the compound semiconductor wafer includes providing a compound semiconductor wafer of gallium arsenide (GaAs).

5. A method of manufacturing a gate quality oxide-compound semiconductor structure as claimed in claim 3 wherein the step of forming an insulating layer by a supersonic gas jet includes thermal evaporation of gallates, $Ga_2O_3$, or gallium.

6. A method of manufacturing a gate quality oxide-compound semiconductor structure as claimed in claim 3 wherein the step of providing the compound semiconductor wafer includes providing a compound semiconductor wafer with a semiconductor device formed thereon.

7. A method of manufacturing a gate quality oxide-compound semiconductor structure comprising the steps of:

providing a multi-wafer epitaxial system including a preparation chamber with a III–V growth chamber attached and a jet vapor deposition chamber attached;

providing a compound semiconductor wafer with a surface;

placing the compound semiconductor wafer in the preparation chamber;

reducing the pressure in the multi-wafer system to $10^{-10}$ Torr;

moving the compound semiconductor wafer to the III–V growth chamber and epitaxially growing layers of compound semiconductor material on the surface of the compound semiconductor wafer;

moving the compound semiconductor wafer to the jet vapor deposition chamber;

providing a supersonic gas jet containing $Ga_2O$, $O_2$ and O gaseous species, or Ga and O gaseous species; and forming an insulating layer onto the surface layer of compound semiconductor material by controlling the supersonic gas jet.

8. A method of manufacturing a gate quality oxide-compound semiconductor structure as claimed in claim 7 wherein the step of providing the supersonic gas jet containing $Ga_2O$, $O_2$ and O gaseous species, or Ga and O gaseous species includes the steps of:

providing a flow of gaseous species such as $Ga_2O$ and $O_2$, or Ga evaporated from an effusion cell using gallates, $Ga_2O_3$, or gallium, respectively, as evaporation source;

providing a flow of inert carrier gas;

mixing the gaseous species such as $Ga_2O$, and $O_2$, or Ga evaporated from effusion cell into the flow of inert carrier gas;

providing a flow of additional $O_2$;

controlling the flow of gaseous species such as $Ga_2O$ and $O_2$, or Ga, the flow of additional oxygen, and the flow of carrier gas using pulsed shutters or valves;

forming a gas discharge plasma using an RF or microwave discharge device; and forming a supersonic gas jet using a high speed nozzle.

9. A method of manufacturing a gate quality oxide-compound semiconductor structure as claimed in claim 7 wherein the step of forming an insulating layer includes the deposition of the first monolayer or submonolayer of $Ga_2O_3$ such that both complete oxidation of the first gallium oxide monolayer and exclusion of semiconductor surface oxidation is achieved using optimized parameters of the gas jet including pulse duration, speed, mole fraction of vaporized $Ga_2O$, $O_2$, O, or Ga, amount of additional oxygen, and energy of plasma.

10. A method of manufacturing a gate quality oxide-compound semiconductor structure as claimed in claim 7 wherein the step of forming an insulating layer includes the deposition of $Ga_2O_3$ bulk material such that low oxide trap density and exclusion of Ga incorporation is achieved using optimized parameters of the gas jet including pulse duration, speed, mole fraction of vaporized $Ga_2O$, $O_2$, O, or Ga, amount of additional oxygen, and energy of plasma.

* * * * *